April 17, 1962

R. G. OSCHMANN 3,030,504

AUTOMATIC GAIN CONTROL CIRCUIT

Filed May 21, 1959

INVENTOR.
RONALD G. OSCHMANN

BY John D. McLaren

ATTORNEY 3,030,504
AUTOMATIC GAIN CONTROL CIRCUIT
Ronald G. Oschmann, Scranton, Pa., assignor to Daystrom, Incorporated, Murray Hill, N.J., a corporation of New Jersey
Filed May 21, 1959, Ser. No. 814,913
3 Claims. (Cl. 250—20)

This invention relates to amplifier circuits and more particularly to amplifier circuits employing delayed automatic gain control.

It is well known by those knowledgeable in the electronic arts that the automatic gain control characteristic curve for amplifiers employing known delayed automatic gain control circuits represents a considerable departure from the ideal curve. This curve, which represents amplifier output signal amplitude vs. input signal amplitude, comprises two distinct portions:

(*a*) A steep characteristic, which is the portion below the input signal amplitude at which the automatic gain control circuit is rendered operative, and (*b*) A relatively flat characteristic, which is the portion above the input signal amplitude at which the automatic gain control circuit is rendered operative.

The part of the curve in the region where these two portions meet is known as the "knee" of the curve. Ideally the "knee" portion should be a sharp change in the curve rather than a gradual one. A characteristic curve having such a knee represents highly desirable automatic gain control operation. Such a curve indicates that the maximum gain capability of the amplifier is being utilized for weak input signals below the predetermined input signal amplitude at which the automatic gain control circuit is rendered operative and that the output signal amplitude is maintained at a more constant value when the gain control circuit is in the operative state. Unfortunately, however, the characteristic curves for amplifiers employing known automatic gain control circuits have knee portions which are gradual rather than sharp.

Accordingly, it is a primary object of this invention to operate an amplifier circuit in a non-linear manner so as to utilize the maximum gain capability of the amplifier when the amplifier input signal amplitude is below a predetermined value and to vary the gain of the amplifier automatically to produce a substantially constant output signal amplitude for all values of input signal amplitudes above that predetermined value.

It is another object of this invention to control the gain of an amplifier by the use of a delayed automatic gain control circuit so that the output signal amplitude is maintained at a more uniform level than is possible with such circuits known to the prior art.

One of the highly desirable features of this invention is that a delayed automatic gain control circuit is produced which utilizes fewer components than prior circuits of this type.

A further feature of this invention is the advantage that the point at which automatic gain control takes effect can be selected by utilizing a diode having the desired threshold conduction potential.

Other objects, features and advantages of my invention will become apparent from a reading of the specification, taken in conjunction with the accompanying drawings in which.

Briefly stated my invention includes an amplifier having input and output circuits and responsive to an incoming signal applied to the input circuit. A signal translating device having an input circuit is coupled to the output circuit of the amplifier.

My invention also includes a potential developing impedance coupled to the input circuit of the signal translating device for developing a potential value which is a function of the amplitude of the incoming signal applied to the input circuit of the amplifier.

My invention further includes the use of a conditionally responsive current-carrying loop having a unidirectionally conductive component, said loop being coupled between the potential developing impedance and the input circuit of the amplifier and responsive to a predetermined threshold potential amplitude developed across said impedance for varying the gain of the amplifier.

When the incoming signal has a value insufficient to produce said predetermined threshold potential amplitude across said impedance, the automatic gain control circuit is inoperative and the maximum gain capability of the amplifier is utilized. When, however, the incoming signal equals or exceeds a value sufficient to produce said predetermined threshold potential amplitude across said impedance, the automatic gain control circuit becomes conductive to maintain the amplifier output signal amplitude substantially constant.

Figure 1:
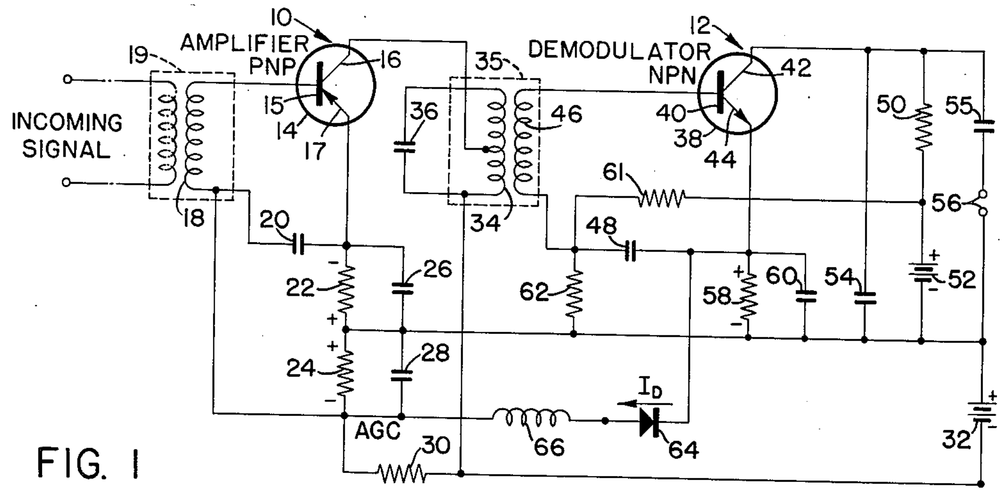
FIG. 1 is a schematic wiring diagram of a circuit employing delayed automatic gain control and utilizing a Zener diode in accordance with one embodiment of my invention.

Referring now specifically to FIG. 1, there is an amplifier stage 10 which is coupled to a signal translating device in the form of a demodulator stage 12. These two stages are further coupled together by a delayed automatic gain control circuit, as will later appear.

The amplifier stage includes a transistor 14 of the PNP type which has an input or base electrode 15, an output or collector electrode 16, and a control or emitter electrode 17. An input circuit comprising the secondary winding 18 of a transformer 19 in series with a capacitor 20 is connected between the base electrode 15 and the emitter electrode 17. The primary of transformer 19 is coupled to an incoming signal source. If transformer coupling is not desired, a resistor or choke coil may be substituted for the transformer winding 18, in which case appropriate alternative means can be provided to couple the incoming signal to the input circuit.

A base biasing arrangement is provided between the emitter and base of the amplifier stage transistor 14 and comprises resistors 22 and 24 with associated bypass capacitors 26 and 28. Resistor 24 is also part of a voltage divider system comprising resistors 24 and 30 and a D.C. low potential source such as a battery 32.

The output circuit of the amplifier is connected between the collector 16 and negative terminal of the battery 32, and comprises the primary 34 of a transformer 35 in parallel with a capacitor 36. The battery 32 provides the collector supply potential with respect to the emitter 17. The amplifier output circuit is coupled by means of the transformer 35 to the demodulator.

The demodulator stage 12 is designed to include a transistor 38 of the NPN type which has an input or base electrode 40, an output or collector electrode 42, and a control or emitter electrode 44. An input circuit comprising the secondary 46 of the transformer 35, in series with a capacitor 48, is connected between the base 40 and the emitter 44. Of course, any suitable coupling means, for example a resistance-capacitance network, could be substituted for the transformer 35 to couple the amplifier stage to the demodulator stage.

An output circuit is connected to the collector 42 and includes a collector load resistor 50 in series with a source of D.C. potential such as a battery 52, the combination being bridged by a capacitor 54. The output signal from the demodulator is fed from the top of resistor 50 through a D.C. blocking capacitor 55 and appears between the output terminals 56.

A potential developing impedance 58 which is shown as a resistor but may also be a reactance, is provided between the emitter 44 and the negative terminal of the battery 52, and is bridged by a capacitor 60. This impedance serves as a potential developing means for actuating the automatic gain control circuit to be described below. The proper biasing potential between the base 40 and emitter 44 of the transistor 38 is provided by a voltage divider comprising the resistors 61 and 62 in series across the battery 52.

A delayed automatic gain control circuit is coupled between the input circuit of the demodulator stage 12 and the input circuit of the amplifier stage 10. This comprises the closed series loop including the potential developing impedance 58, a Zener diode 64, an RF choke 66, and the resistor 24. In order that the desired AGC action be achieved, a Zener diode must be selected which has the required predetermined threshold conduction potential. This condition will be satisfied if the diode has a threshold conduction potential $V_t$ somewhat greater than a potential value $V_1$ developed across the impedance 58 when an incoming signal of very small amplitude is applied to the input of the amplifier stage 10. With such an arrangement, the automatic gain control action will be delayed until the incoming signal has a sufficient amplitude to produce the predetermined threshold potential across the impedance 58.

The circuit of FIG. 1 operates in the following manner. The incoming signal applied to the primary of transformer 19, is amplified in the first stage 10 and demodulated in the second stage 12, the demodulated signal appearing at the output terminals 56. Moreover, whenever this incoming signal is applied to the input circuit of the amplifier stage, a potential which is a function of the incoming signal amplitude is developed across the impedance 58 in the emitter circuit of the demodulator.

When the incoming signal amplitude is insufficient to produce across the potential developing impedance 58 a potential equal to or greater than the diode threshold conduction potential, the diode does not conduct and the base to emitter bias of the transistor 14 is unaffected. The gain of the amplifier transistor 14 is controlled by this biasing potential, and hence for such insufficient incoming signal amplitudes, there is no change in amplifier stage gain.

When, however, the incoming signal amplitude is sufficient to produce across the impedance 58 a potential equal to or greater than the diode threshold conduction potential, the Zener diode 64 conducts and a diode current $I_d$ is produced in the automatic gain control circuit. This current flows in the direction indicated in FIGURE 1 from the top of impedance 58, through the diode 64, the RF choke 66, the resistor 24 and back to the lower end of impedance 58. The direction of the current $I_d$ in resistor 24 is opposite to the current produced in this resistor by the battery 32. The net IR potential drop across resistor 24 is therefore reduced and thus the biasing potential between the base 15 and emitter 17 is also reduced. Reducing the bias potential between the base and emitter of a PNP transistor reduces the emitter current and consequently the gain. The gain of the PNP amplifier stage 10 is therefore reduced.

Thus it is seen that when an incoming signal to the amplifier reaches a certain amplitude, the automatic gain control circuit becomes conducive and acts to reduce the gain of the amplifier. The overall manner of operation is such that when the incoming signal is sufficient to produce a potential across the impedance 58 greater than the diode threshold conduction potential, the signal produced in the amplifier output circuit and at the output terminals 56 is maintained at a substantially constant value, although the incoming signal amplitude varies.

When the incoming signal is insufficient in amplitude to render the diode conductive, it is seen that the gain of the amplifier is not reduced and hence the maximum gain capability of the amplifier is utilized at this time.

Figure 2:
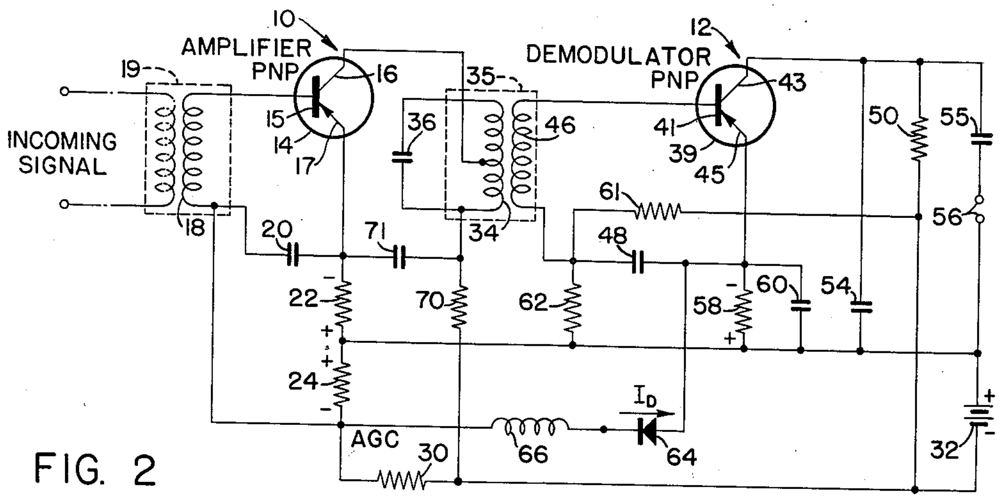
FIG. 2 is a variation illustrating a second embodiment of my invention.

FIG. 2 is another circuit employing the concept of my invention wherein like numerals indicate like components of FIG. 1. This circuit however differs from the circuit of FIG. 1 in several respects now to be described.

In the amplifier stage 10 of FIG. 2, a resistor 70 is provided in series with the collector supply potential for the PNP transistor 14 and a capacitor 71 is connected between the top of this resistor and the emitter 17. Further, the emitter bypass capacitors 26 and 28 are dispensed with.

In the demodulator stage 12 of FIG. 2, a PNP transistor 39 having an input or base electrode 41, an output or collector electrode 43 and a control or emitter electrode 45, has been substituted for the NPN transistor 38 of FIGURE 1. Thus in FIG. 2, both the amplifier and demodulator stages employ the same transistor type. Since operating supply potentials for PNP type transistors are reversed in polarity from those employed for NPN types, the collector supply potential for the PNP demodulator transistor 39 can be taken directly from the battery 32, and the battery 52 in FIG. 1 is therefore eliminated.

In the automatic gain control circuit, the Zener diode 64 is connected in reverse relationship to that shown in FIG. 1.

The circuit of FIG. 2 operates as follows. The incoming signal is amplified in the first stage 10 and demodulated in the second stage in similar manner to that of FIG. 1. Furthermore, as in FIG. 1, when the incoming signal has a very low amplitude, the automatic gain control circuit is not conductive. Similarly when the incoming signal has an amplitude sufficient to develop across impedance 58 a potential equal to or greater than the threshold conduction potential of the diode 64, the diode conducts and a diode current $I_d$ is produced in the automatic gain control circuit, but which is opposite in direction to the diode current in FIG. 1. The net current through the resistor 24 is therefore increased, resulting in an increase in the base to emitter bias on the amplifier transistor 14 rather than a decrease as in FIG. 1. The increased bias increases the collector current in the amplifier transistor 14 and this increases the potential drop across the resistor 70, thus decreasing the collector voltage and hence also the gain of the amplifier.

It will be appreciated that the automatic gain control circuit of either FIG. 1 or FIG. 2 can be designed to operate at various selected incoming signal amplitudes simply by selecting a Zener diode which conducts at an appropriate threshold potential. Further, any number of stages of amplification can be employed, each controlled by the automatic gain control circuit. In addition, the various stages can be easily controlled at different threshold levels merely by employing diodes having different threshold potentials for the different stages.

Figure 3:
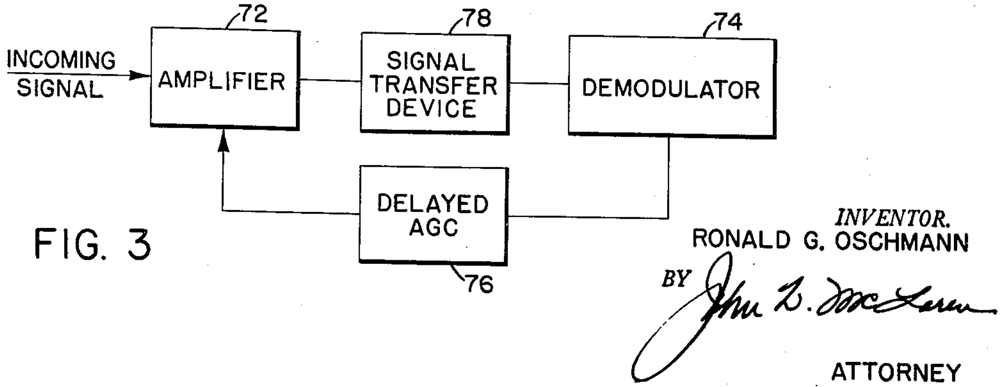
FIG. 3 is a block diagram showing a still further embodiment of my invention.

FIG. 3 is a block diagram showing a variation of my invention which is desirable for certain applications. In this embodiment there is an amplifier 72, a signal translating device in the form of a demodulator 74, and an AGC circuit 76 coupled therebetween, in the manner shown in either FIG. 1 or FIG. 2 above. In addition, there is provided a signal transfer device 78 for coupling the output of the amplifier 72 to the input of the demodulator 74. The signal transfer device may take the form of a buffer stage, an amplifier stage, a coupling circuit or any other device or network suitable for transferring a signal from the amplifier 72 to the demodulator 74. The transfer device, however, is not controlled by the AGC circuit. Such an arrangement would be useful for example in an amplifier wherein it would be desirable to have a predetermined degree of AGC control and yet utilize the signal transfer device in such a manner that its operation would be unaffected by the AGC circuit control potential.

It will be observed in the explanations above that I have obtained the Zener diode threshold potential from an impedance 58 operating in conjunction with a signal translating device in the form of a transistor demodulator 12. This potential could also be developed by the use merely of a suitable impedance or by an impedance in conjunction with other suitable translating devices, such as, for example, a diode, transformer, vacuum tube, etc.

Further, the circuit of FIG. 1 has been described with reference to an amplifier stage utilizing a PNP type transistor and a demodulator stage utilizing an NPN type transistor. If desired, a suitable NPN type could be employed in the amplifier stage and a PNP type in the demodulator stage. Likewise, the circuit of FIG. 2 would operate as well if suitable NPN type transistors were substituted in place of the PNP type employed. Naturally if a PNP type were substituted for an NPN type, and vice versa, such change would, as will be well understood in the art, necessitate a reversal of the polarities of operating potentials applied to the various electrodes of the transistors. Moreover, the concept of my invention can be applied to vacuum tube circuitry as well as to transistor circuitry.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

I claim:

1. In combination, a first transistor having input, output and control electrodes, said transistor being responsive to an incoming signal supplied between said input and control electrodes for producing an output signal in a circuit connected to said output electrode, fixed biasing means coupled to said input electrode and to said control electrode for controlling the operation of said first transistor, said fixed biasing means including first and second resistors connected in series between said input and control electrodes and having potentials of opposed polarity thereacross in the absence of said incoming signal, a second transistor having input, output and control electrodes, said output signal from said first transistor being coupled between said input and control electrodes of said second transistor, an impedance coupled to said control electrode of said second transistor for developing a potential across said impedance as a function of said incoming signal when said incoming signal has a low amplitude, a diode coupled to said impedance and to a portion of said fixed biasing means and further means connecting said impedance to said biasing means to complete a closed circuit loop including said diode said impedance and one of said resistors, said diode being unidirectionally conductive in response to a predetermined threshold conduction potential greater than the potential value across said impedance corresponding to said low incoming signal amplitude, said diode when in the conductive state operating to reduce the control electrode current in said first transistor by varying its biasing potential to thus maintain the output amplitude of said first transistor substantially constant with changes in the amplitude of said incoming signal, said diode being non-conductive at potentials across said impedance which are below said predetermined threshold conduction potential.

2. In combination, a first transistor having input, output and control electrodes, said transistor being responsive to an incoming signal supplied between said input and control electrodes for producing an output signal in a circuit connected to said output electrode, fixed biasing means coupled to said input electrode and to said control electrode for controlling the operation of said first transistor, said fixed biasing means including first and second resistors connected in series between said input and control electrodes and having potentials of opposed polarity thereacross in the absence of said incoming signal, a second transistor having input, output and control electrodes, said output from said first transistor being coupled between said input and control electrodes of said second transistor, a third resistor connected in the output electrode potential supply line of said first transistor, an impedance coupled to said control electrode of said second transistor for developing a potential across said impedance as a function of said incoming signal when said incoming signal has a low amplitude, a diode coupled to said impedance and to a portion of said fixed biasing means and further means connecting said impedance to said biasing means to complete a closed circuit loop including said diode said impedance and said first resistor, said diode being unidirectionally conductive in response to a predetermined threshold conduction potential greater than the potential value across said impedance corresponding to said low incoming signal amplitude, said diode when in the conductive state operating to reduce the output electrode operating potential of said first transistor as a result of an increased potential drop across said third resistor to thus maintain the output amplitude of said first transistor substantially constant with changes in the amplitude of said incoming signal, said diode being non-conductive at potentials across said impedance which are below said predetermined threshold conduction potential.

3. In combination, an amplifier having input and output circuits and responsive to an incoming signal of varying amplitude applied to said input circuit, a fixed biasing means coupled to said input circuit for establishing the quiescent operating point of said amplifier, said fixed biasing means including first and second resistors connected in series and having potentials of opposed polarity thereacross in the absence of said incoming signal, a signal translating device coupled to the output circuit of said amplifier and including an impedance for developing a potential as a function of said incoming signal, and unidirectionally conductive means, said first resistor, said impedance and said unidirectionally conductive means being connected in series with one another to form a closed circuit loop, said unidirectionally conductive means being responsive to a predetermined threshold potential developed across said impedance for cooperating with said first resistor for varying the bias applied to said amplifier to maintain the amplitude of the amplifier output signal substantially constant whenever the potential developed across said impedance reaches said predetermined threshold potential, said unidirectionally conductive means being non-conductive at potentials below said predetermined threshold potential.

References Cited in the file of this patent

UNITED STATES PATENTS

| | | |
|---|---|---|
| 1,939,398 | Koch | Dec. 12, 1933 |
| 2,838,660 | Bycer | June 10, 1958 |
| 2,850,695 | Bishop | Sept. 2, 1958 |
| 2,882,350 | Stern | Apr. 14, 1959 |
| 2,939,950 | Holmes | June 7, 1960 |
| 2,941,046 | Pokrant | June 14, 1960 |

FOREIGN PATENTS

| | | |
|---|---|---|
| 414,187 | Great Britain | Aug. 2, 1934 |